United States Patent [19]
Zachman et al.

[11] Patent Number: 5,322,565
[45] Date of Patent: Jun. 21, 1994

[54] METHOD AND APPARATUS FOR THROUGH HOLE SUBSTRATE PRINTING

[75] Inventors: Joseph M. Zachman; Clyde E. Ragan, both of Greentown; Steven L. Alexander, Westfield; Bruce A. Myers; Charles T. Eytcheson, both of Kokomo, all of Ind.

[73] Assignee: Delco Electronics Corporation, Kokomo, Ind.

[21] Appl. No.: 810,246

[22] Filed: Dec. 19, 1991

Related U.S. Application Data

[62] Division of Ser. No. 503,407, Apr. 2, 1990, Pat. No. 5,080,929.

[51] Int. Cl.$^5$ ............................................. B05C 13/00
[52] U.S. Cl. .................... 118/500; 118/50; 118/704; 118/706; 427/97; 101/114
[58] Field of Search .............. 118/500, 50, 704, 706, 118/52; 427/97; 101/114, 389.1

[56] References Cited

U.S. PATENT DOCUMENTS

| | | | |
|---|---|---|---|
| 4,293,377 | 10/1981 | Miyajima | 427/97 |
| 4,323,593 | 4/1982 | Tsunashima | 427/97 |
| 4,492,180 | 1/1985 | Martin | 118/704 |
| 4,559,718 | 12/1985 | Tadohoro | 118/52 |
| 4,655,162 | 4/1987 | Kameyama | 118/53 |
| 4,710,395 | 12/1987 | Young | 427/97 |
| 4,817,556 | 4/1989 | Mears et al. | 118/503 |

Primary Examiner—W. Gary Jones
Assistant Examiner—Brenda Lamb
Attorney, Agent, or Firm—Cary W. Brooks; Mark A. Navarre

[57] ABSTRACT

A method and apparatus are disclosed for enabling automated printing of through holes extending between top and bottom surfaces of a ceramic substrate or the like. The perimeter of the substrate is placed on a support that locates the bottom surface of the substrate spaced from a member that interacts with the interior portion of the substrate. The interacting member has holes that correspond to the through holes in the substrate, and it is moved generally perpendicular to the substrate to a position where it is in juxtaposition with the bottom surface of the substrate and its holes are in registration with the holes in the substrate. Conductive material is applied to the top surface of the substrate and a vacuum is applied to the holes in the interacting member to pull the conductive material through the through holes in the substrate. The vacuum is then discontinued and the interacting member is moved back to a position where it is spaced from the bottom surface of the substrate.

5 Claims, 4 Drawing Sheets

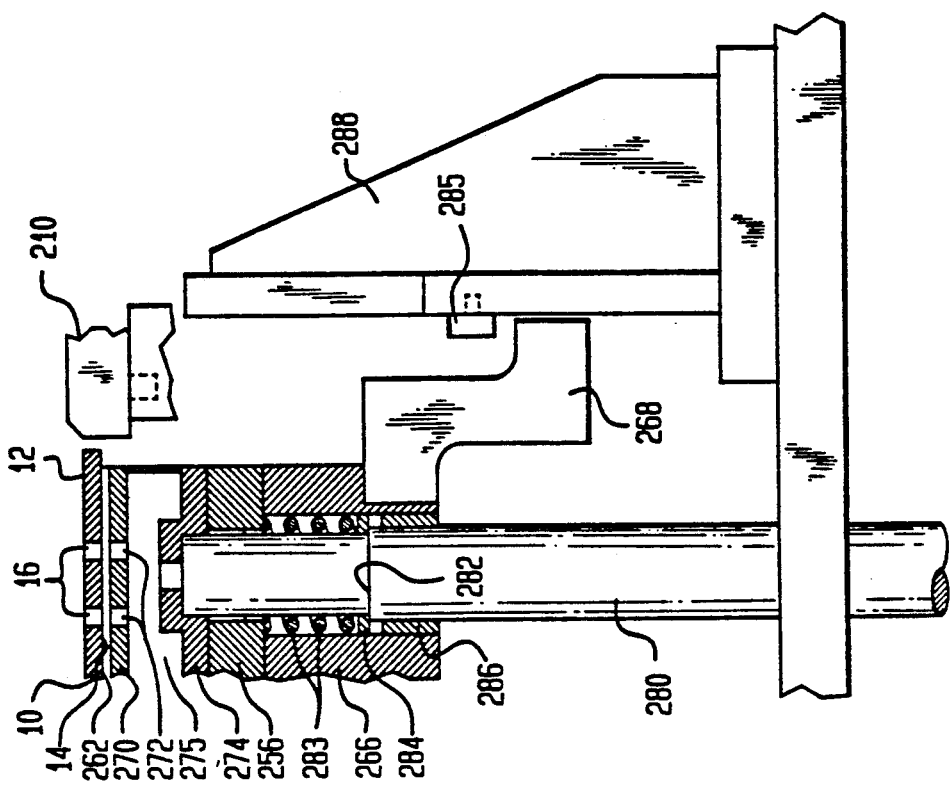
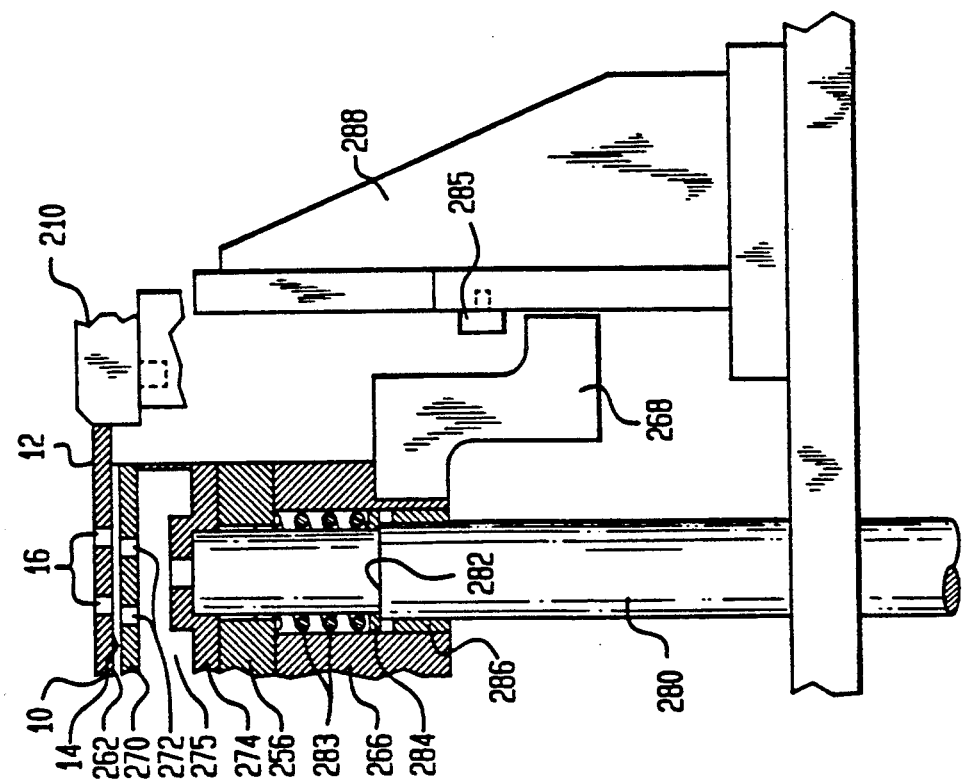

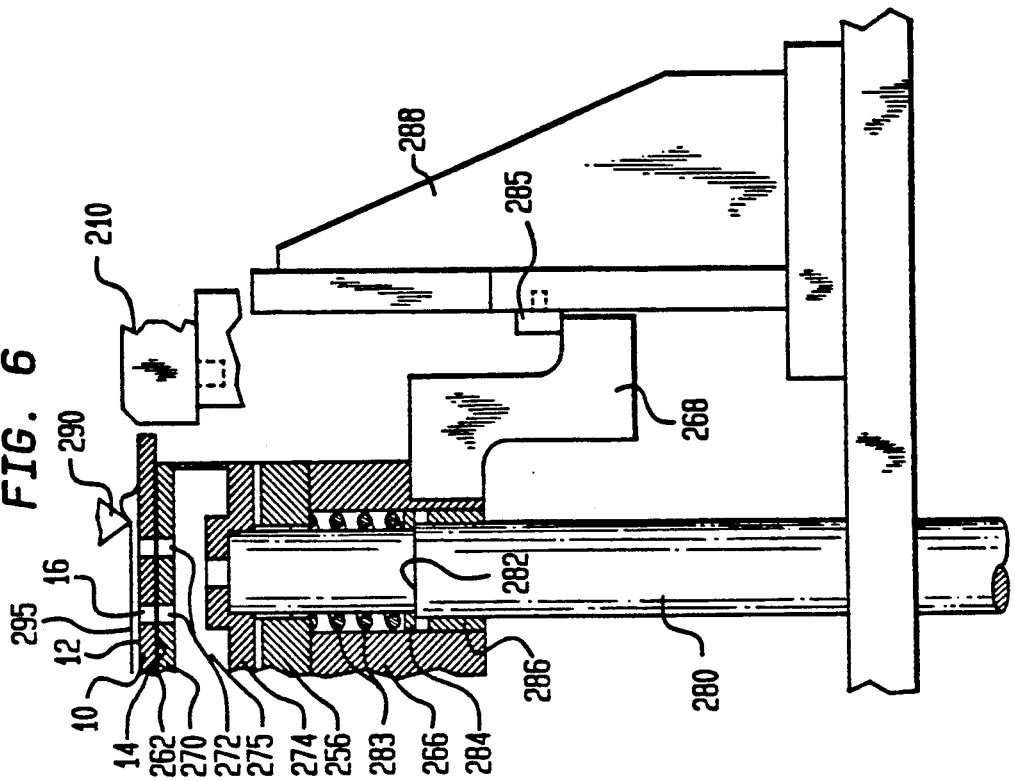
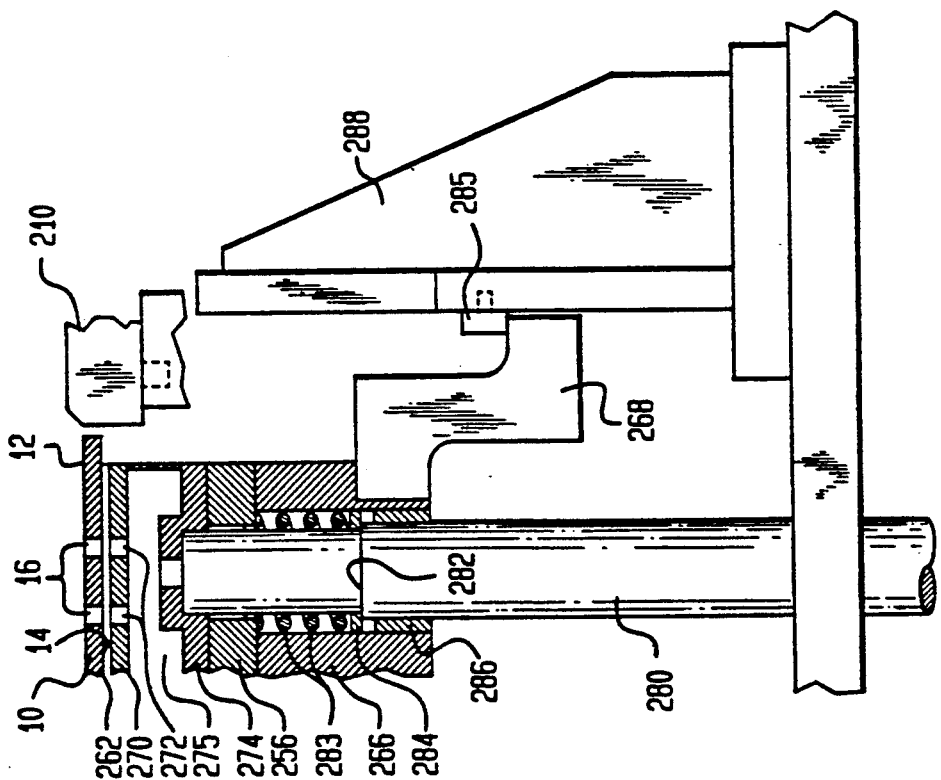

METHOD AND APPARATUS FOR THROUGH HOLE SUBSTRATE PRINTING

This is a division of application of Ser. No. 07/503407 filed on 02-APR90, now U.S. Pat. No. 5,080,929.

FIELD OF THE INVENTION

This invention relates to the manufacture of substrates including electrical circuit paths on the upper and lower surfaces thereof and through holes extending therebetween and particularly to the application of conductive material to the inner surfaces of the through holes to provide an electrical connection between circuit paths.

BACKGROUND OF THE INVENTION

The application of conductive material to the inner surfaces of the through holes, referred to as through hole printing, is presently performed using manual print systems. An operator hand loads a substrate onto a support referred to in the art as a print nest. The operator locates the substrate on the print nest so that the through holes in the substrate are aligned with corresponding holes in the print nest. The operator then activates a hold down vacuum, which is applied through holes in the nest located adjacent to the perimeter of the substrate, to clamp the substrate to the nest.

The print nest is thereafter pneumatically moved into a printing position under a printing screen. The printing operation is then performed whereby the desired pattern of conductive paths, including the conductive material for the through holes, is printed on the substrate, and the nest is moved back to the load/unload position. The operator then activates a second vacuum that is applied to the corresponding holes in the nest and serves to pull the conductive material through the through holes in the substrate and coat the inner walls of the through holes. U.S. Pat. No. 4,710,395 issued to Young et al. on Dec. 1, 1987 discloses a method and apparatus that can be used to increase the uniformity of this coating operation.

This completes the printing operation, and the operator deactivates both vacuums and removes the substrate from the print nest. Before loading the next substrate, the operator must wipe away excess conductive material that has been pulled through the through holes of the previous substrate onto the surface of the nest. Otherwise, this excess conductive material will smear on the bottom surface of the next substrate and cause electrical shorts between conductive paths on the lower surface.

It is clear that the foregoing process is both labor intensive and time consuming and thus makes the product produced by this process expensive. Furthermore, this process does not lend itself to automation in view of the need to wipe away the excess conductive material from the print nest each time a through hole printing operation is performed.

SUMMARY OF THE INVENTION

The apparatus and method of the present invention eliminates the shortcomings of the prior art and permits the printing operation to be performed quickly. It also permits the operation to be performed without the participation of an operator. More particularly, it permits the operation to be automated.

In one embodiment of the invention, the apparatus comprises means for supporting a perimeter portion of the substrate and means for interacting with the bottom surface of an interior portion of the substrate, the interacting means being located alongside of the support means. The interacting means, which in terms of the art could be considered to be an inner nest, includes holes corresponding to the holes in the substrate. The apparatus further comprises means for reciprocally moving the interacting means generally perpendicular to the substrate between a position in which the interacting means is spaced from the bottom surface of the substrate and a position in which the interacting means is in juxtaposition with the bottom surface of the substrate. Still further, the apparatus comprises means for applying conductive material to the top surface of the substrate and means for applying a vacuum to the holes in the interacting means to pull the conductive material through the through holes of the substrate, whereby printing occurs. The moving means moves the interacting means into juxtaposition with the bottom surface of the substrate when the conductive material applying means is to apply the conductive material to the top surface of the substrate and moves the interacting means to its spaced position from the substrate after the conductive material applying means has applied the conductive material to the top surface and the vacuum means has applied a vacuum to the holes in the interacting means.

In accordance with another aspect of the invention, the support means, which in terms of the art could be considered to be an outer nest, is reciprocally movable by the moving means perpendicular to the plane of the substrate. The moving means moves the support means to a lower position when the substrate is to be loaded onto the support means prior to the printing occurring and again when the substrate is to be unloaded from the support means after printing occurs. The moving means moves the support means to an upper position when printing is to occur. This movement of the support means facilitates mechanical movement of the substrate onto and away from the support means.

In accordance with still another aspect of the invention, the apparatus further comprises means for locating the substrate in a particular position and means for holding the substrate in the particular position. The locating means comprises a multiple of locators disposed about the perimeter of the substrate when it is supported by the support means. Some of the locators are fixed, and other locators, in opposed relationship to the fixed locators, are movable in the plane of the substrate to move the substrate against the fixed locators prior to the holding means holding the substrate in place.

The holding means comprises holes in the support means connected to, the vacuum applying means. The vacuum applying means applies a vacuum to the holes in the support means after the locating means properly locates the substrate and before the moving means moves the interacting means into juxtaposition with the interior of the substrate. The application of the vacuum to the holes in the support means secures the substrate in place.

It is seen that this apparatus and the method embodied in the steps performed by the apparatus facilitate automation of the application of conductive material to a substrate. Because the interacting means moves perpendicularly in and out of juxtaposition with the substrate, any excess conductive material left on the top surface of the interacting means causes no problem. This is because the excess conductive material surrounds the holes in the interacting means, and the next substrate to be printed is already in the aligned position before the interacting means comes into contact with the substrate. Therefore, any such excess conductive material deposited on the next substrate is deposited exactly at the location of the holes in the substrate, and no shorting of conductive paths occur.

The invention may be further understood from the following more detailed description taken with the accompanying drawing.

BRIEF DESCRIPTION OF THE DRAWINGS

FIGS. 3 through are partial sectional views taken along line 3-3 of FIG. 1 showing the steps of the printing operation of the apparatus of FIG. 1.

The drawings are not necessarily to scale.

DETAILED DESCRIPTION

Figure 1:
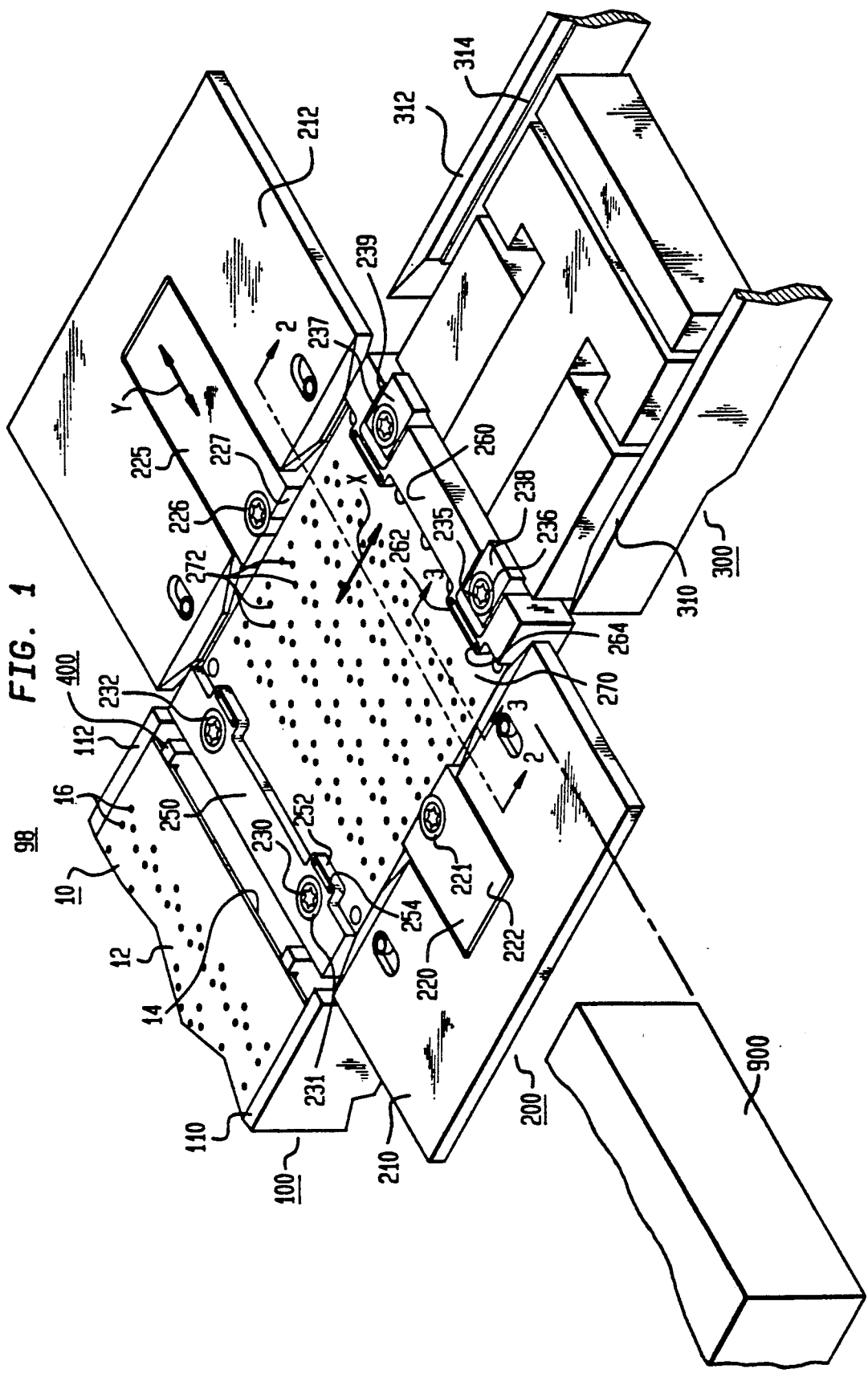
FIG. 1 is a top perspective view of apparatus in accordance with the present invention.

Referring now to FIG. 1, there is shown apparatus 98 in accordance with the present invention. Apparatus 98 comprises a preprint station 100, a print station 200 and a post print station 300. All three stations accommodate a planar substrate 10 that is formed from an electrically non-conductive material such as ceramic. The substrate 10 includes opposed top and bottom surfaces 12 and 14 and an array of through holes 16 extended between these surfaces.

As the names imply, the substrate 10 is located in the preprint station 100 prior to the printing operation, in the print station 200 during the printing operation, and in the post print station 300 after the printing operation. Means, such as a walking beam 400, periodically advances the substrate 10 from one station to the next. The timing of the advance corresponding to the time it takes to complete the hereinafter described complete cycle of the printing operation.

The preprint station 100 and post print station 300, respectively, include pairs of guide rails 110 and 112, and 310 and 312, respectively. Facing surfaces of each pair of guide rails 110 and 112, and 310 and 312, are spaced from one another slightly greater than the width of the substrate 10. In addition, the facing surfaces of each pair of guide rails 110, 112 and 310, 312 include ledges (one of which, 314, is shown on guide, rail 312) for accommodating opposed side portions of the substrate 10, the ledges serving to support the substrate 10 in a suspended position.

The print station 200 also includes means for supporting the substrate 10 in a suspended position. The support means comprises a pair of support members 250 and 260 that extend between a pair of spaced guide blocks 210 and 212. The support member 250 has a pair of shoulders 252 that protrude toward the support member 260. Similarly, the support member 260 has a pair of shoulders 262 that protrude toward the support member 250. The distance between the shoulders 252 and 262 is such that they engage just the end portions of the substrate 10, which portions typically have no through holes 16. As hereinafter described in greater detail, the support members 250 and 260 are part of a common assembly that is reciprocally movable perpendicularly to the plane of the substrate 10.

The print station 200 further includes means for locating the substrate 10 in a particular position. The locating means comprises stationary locators 220 and 230 and movable locators 225 and 235. The stationary locator 220 consists of a stop 221 fastened to a fixed block 222 that is situated within a recess in the guide block 210. The movable locator 225 is opposite to the guideblock 210 and consists of a stop 226 fastened to a movable block 227 that is situated within a recess in the guide block 212. The block 227 is reciprocally movable in the direction of arrow Y in FIG. 1.

The stationary locator 230 consists of a pair of spaced stops 231 and 232 that are situated between and at one end of the guide blocks 210 and 212. The stops 231 and 232 are fastened to the support member 250 and are situated in a line that extends parallel to a line extending between the stops 221 and 226. Finally, the movable locator 235 consists of a pair of spaced stops 236 and 237 that are situated between and at the other end of the guide blocks 210 and 212 from the stops 231 and 232. The stops 236 and 237 are fastened to movable blocks 238 and 239 that are situated in a line within recesses in the support member 260 and that extends parallel to a line extending between the fixed stops 230 and 232. The blocks 238 and 239 are reciprocally movable in the direction of arrow X in FIG. 1.

The print station 200 further comprises means for holding the substrate 10 in a fixed position once it has been located in the particular position by the locating means. The holding means comprises a hole 254 in each shoulder 252 of the support member 250 and a hole 264 in each shoulder 262 of the support member 260. The holes 254 and 264 are connected to means for applying a vacuum to the holes. This means (not shown) is known in the art, an example being found in U.S. Pat. No. 4,710,395 referred to in the Background of the Invention, and hereby incorporated herein.

The print station 200 further comprises means for interacting with the substrate 10 when it is held in the particular position on the support means by the holding means. The interacting means includes a planar interacting member 270 having an array of holes 272 that correspond to the array of through holes in the substrate 10. The interacting member 270 lies in a plane that lies parallel to the plane of the substrate 10 when the substrate is supported on the shoulders 252 and 262 of the support members 250 and 260. As hereinafter described, the interacting member 270 is movable perpendicular to this plane.

Figure 2:
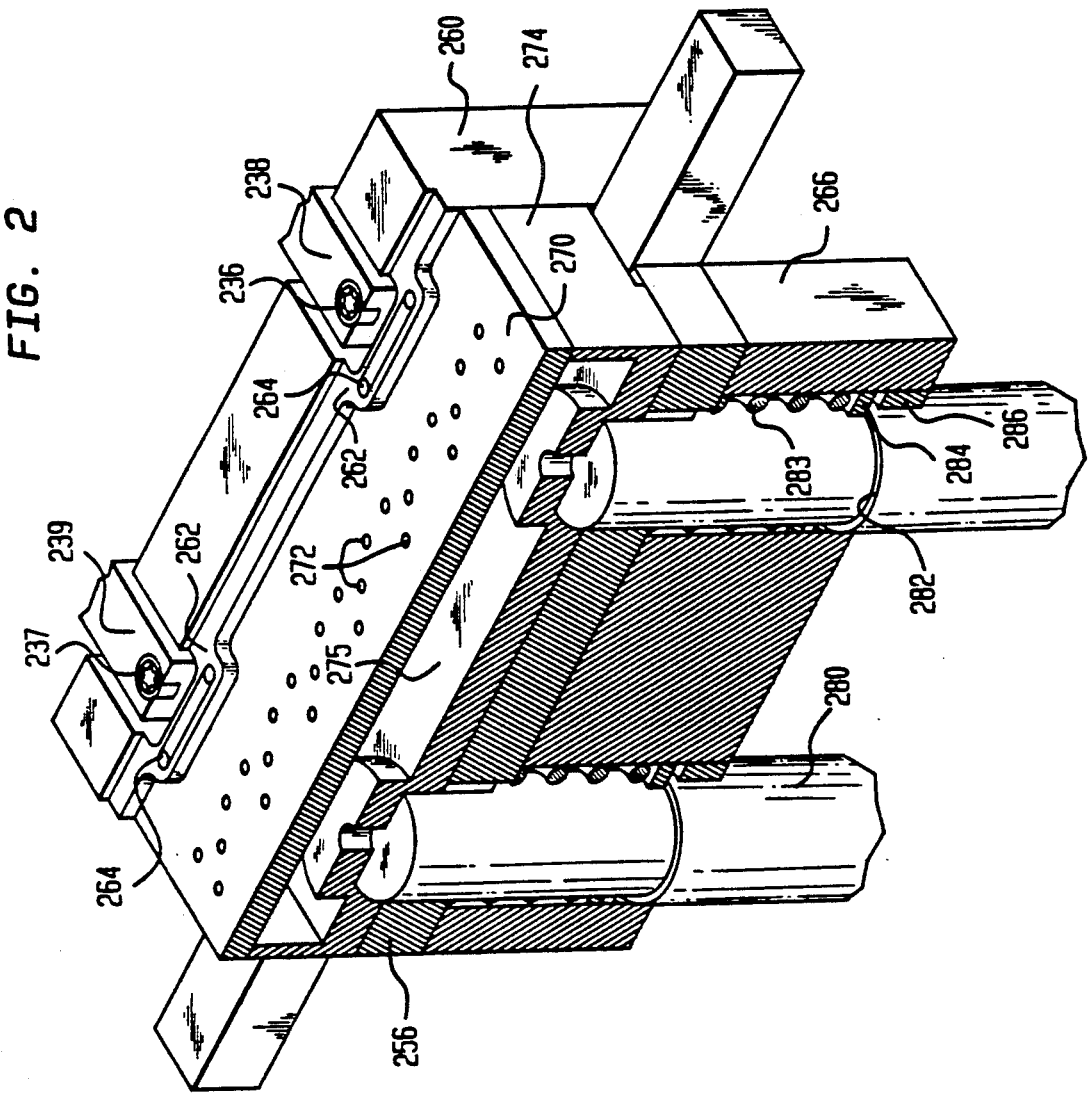
FIG. 2 is a sectional perspective view taken along line 2-2 of FIG. 1.

Referring now to FIG. 2. There is shown a cross-sectional perspective view taken along line 2-2 of FIG. 1 of the mechanism for moving the support members 250 and 260 and the interacting member 270. The interacting member 270 is positioned on the top of the upstanding sides of a cup-shaped member 274 to form a hollow chamber 275 that communicates with all of the holes 272 in the interacting member 270. The bottom of the cup-shaped member 274 has recesses therein within which the upper ends of vertically displaceable lift rods 280 are positioned. The interacting member 270 is joined to the cup-shaped member 274, which is in turn joined to lift rods 280 and, therefore, these members move together as a unit.

The lift rods 280 extend through openings in a plate 256 and a base 266. The plate 256 is joined to the base 266 and is either joined to or integral with the support members 250 (see FIG. 1) and 260. Consequently, these members also move together as a unit. The upper ends of the lift rods 280 are reduced in diameter to form shoulders 282, and the openings in the plate 256 are slightly larger than the reduced diameters of the lift rods. The openings in the base 266 are both larger than those in the plate 256 and larger than the full diameter of the lift rods 280. Shoulders 282 formed by the change in diameter are situated within the openings in the base 266.

Disposed about the reduced diameter portion of each lift rod 280 and contained within each opening in the base 266 is a spring retainer 284 and a compression coil spring 283. The spring retainer 284 rests on the shoulder 282 of the associated lift rod 280 and is vertically displaced within the associated opening in the base 266. The coil spring 283 is restrained in a compressed condition between the spring retainer 284 and the bottom surface of the plate 256.

Disposed about the full diameter portion of each lift rod 280 and fixedly contained within the lower end of each opening in the base 266 is a bearing 286. The lift rods 280 move up and down within the bearings 286 between an upper position and a lower position, the reciprocal movement of the lift rods being controlled by means, such as a cam (not shown), which are well known in the art.

Referring now to FIGS. 3, 4, 5, and 6, there are shown partial sectional views of apparatus 98 through line 3—3 of FIG. 1 which show the positions of parts of apparatus 98 during typical steps of a printing operation in which conductors are printed on substrate 10.

Referring now to FIGS. 1 through 3, the operation of this embodiment of the present invention is as follows. When a substrate 10 is to be moved from the preprint station 100 to the print station 200, the lift rods 280 are in their lower position. Consequently, the cup-shaped member 274, which is joined to the lift rods 280, and the interacting member 270, which is joined to the cup-shaped member, are in their lower position. In addition, as a result of the force exerted by the coil springs 283, the plate 256 is pressed against the bottom surface of the cup-shaped member 274. Therefore, the plate 256 and base 266, and the support members 250 and, 260 joined thereto, are in their lower position.

The location of these members in their lower position relative to a substrate 10 positioned on the support members 250 and 260 is shown in FIG. 3. It is seen that the bottom surface 14 of the substrate 10 is resting on the top surface of the shoulders 262 of the support member 260 and thereby the top surface of the shoulders 252 of the holding member 250 (FIG. 1). In addition, the top surface of the interacting member 270 is located a distance below the top surface of the shoulders 262 and 252. The substrate 10 is, therefore, readily moveable from the preprint station 100 to the print station 200 without any engagement between the substrate 10 and the print station 200 other than the shoulders 252 and 262 of the support members 250 and 260 engaging end portions of the substrate 10 to support the substrate 10 in a suspended position.

With the substrate 10 resting on the shoulders 252 and 262 of the support members 250 and 260, the movable locators 225 and 235 are operated. The operation of the movable locator 225 results in the stop 226 on the movable block 225 engaging the adjacent side edge of the substrate 10 to displace the opposite side edge of the substrate 10 into engagement with the stop 221 of the stationary locator 220. The operation of the movable locator 235 results in the stops 236 and 237 on the movable blocks 238 and 239 engaging the adjacent end edge of the substrate 10 to displace the opposite end edge of the substrate 10 into engagement with the stops 231 and 232 of the stationary locator 230. The stops of the stationary locators 220 and 230 serve to locate the substrate 10 in a particular position, the particular position being the position shown in FIG. 4 in which the holes 16 in the substrate are in registration with corresponding holes 272 in the interacting member 270.

With the substrate 10 located in the particular position, a vacuum is applied to the holes 254 and 264 in the shoulders 252 and 262 of the holding members 250 and 260. The end portions of the substrate 10 resting on the shoulders 252 and 262 have no through holes in registration with the holes 254 and 264 in the shoulders. Therefore, the application of the vacuum to the holes 254 and 264 clamps the substrate 10 to the shoulders 252 and 262 and holds the substrate in the particular position. Then with the substrate 10 held in the particular position, the movable locators 225 and 235 are returned to their original positions.

At the same time that the movable locators 225 and 235 return to their original positions, the lift rods 280 start to rise. As the lift rods 280 rise, in addition to moving the interacting member 270 upward, the rods 280 act to compress the coil springs 283, which in turn act to maintain the plate 256 in engagement with the bottom of the cup-shaped member 274. Consequently, the support members 250 and 260, which are joined to the plate 256, move upward with the lift rods 280.

Then when the lift rods 280 move this assembly upward to the position shown in FIG. 5, an arm 268 joined to and extending laterally from the base 266 engages a fixed block 285 mounted on a support 288 adjacent to the base. This engagement arrests the upward motion of the base 266 and thereby the plate 256 and support members 250 and 260. Continued upward movement of the lift rods 280 results in upward movement of the cup-shaped member 274, and thereby the interacting member 270. It also results in compression of the coil springs 283.

Referring now to FIGS. 1 and 6, at the end of their upward travel, the lift rods 280 position the top surface of the interacting member 270 in the same plane as the top surface of the shoulders 252 and 262 of the support members 250 and 260. Thus, the top surface of the interacting member 270 also engages the bottom surface 14 of the substrate 10 held in place by the vacuum applied to the holes 254 and 264 in the shoulders 252 and 262. This is the print position, and a screen printer, shown schematically as 290 (900 in FIG. 1), is moved on top of the substrate 10 to apply conductive material 295 to the top surface 12 of the substrate in a pattern that includes the holes 16 in the substrate. A vacuum is applied to the chamber 275 for a predetermined period of time. The vacuum can be applied during or after the print stroke. The vacuum is applied by means known in the art (not shown) such as disclosed in U.S. Pat. No. 4,710,395 referred to in the Background of the Invention. The vacuum draws the conductive material 295 through the holes 16 in the substrate 10 to coat the walls of the holes.

When the printing operation is completed, the application of a vacuum to the chamber 275 is discontinued, while the vacuum applied to the holes 254 and 264 in the shoulders 252 and 262 of the support members 250 and 260 continues to hold the substrate 10 in place. The lift rods 280 start to move downward, and the cup-shaped member 274 moves with the rods. Because the shoulders 252 and 262 remain stationary, the interacting member 270 separates from the substrate 10. As the downward travel of the lift rods 280 continues, the cup-shaped member 274 engages the plate 256, as shown in FIG. 5, and the interacting member 270, cup-shaped member 274, plate 256, and base 266 thereafter move downward together. Consequently, the shoulders 252 and 262 of the support members 250 and 260 joined to the base 266 move downward also, lowering the substrate 10 held on the shoulders by the vacuum applied to the holes 254 and 264 in the shoulders. When the lift rods 280 move to the position shown in FIG. 4, the vacuum is removed from the holes 254 and 264 in the shoulders 252 and 262, enabling the printed substrate 10 to be readily moved to the post-print station 300 and another substrate moved from the pre-print station 100 to the print station 200.

It is seen that should any conductive material be left on the top surface of the interacting member 270 after the foregoing operation is completed, it poses no problem. That is because the interacting member 270 only moves perpendicularly to the plane of the substrate 10 and then only after the substrate has been placed in the position in which the holes 16 in the substrate are in registration with the holes 272 in the interacting member. Thus, any conductive material left on the top surface of the interacting member 270 is only placed in engagement with surfaces immediately surrounding the holes 16 in the substrate 10 and is not smeared by the movement of the substrate in and out of the print station 200. Consequently, there is no need to remove such conductive material from the top surface of the interacting member 270, enabling automation of the printing operation.

An embodiment of apparatus 98 has been made and tested. It was found that a substrate 10 could have conductors printed thereon in about three seconds.

It is to be understood that the apparatus and methods which have been described are illustrative. Modifications may readily be devised by those skilled in the art without departing the spirit and scope of the invention.

The embodiments of the invention in which an exclusive property or privilege is claimed are defined as follows:

1. A combination comprising an apparatus for applying conductive material to a substrate, and a non-conductive substrate having first and second opposed surfaces, perimeter portions, and an interior portion having through holes extending between the first and second surfaces, the apparatus comprising:
    a support for supporting a first perimeter portion of the substrate;
    a nest including a platform for interacting with the first surface of the interior portion of the substrate when supported by the support, the platform including holes corresponding to the through holes in the interior portion of the substrate; and
    a drive for reciprocally moving the platform generally perpendicular to the substrate when supported by the support, the drive moving the platform between a position in which the platform is spaced from the first surface of the substrate and a position in which the platform is in juxtaposition with and engaging the first surface of the substrate; and
    a printer for applying conductive ink material to the second surface of the substrate, and a vacuum device connected to the holes in the platform for drawing the ink through the through holes in the substrate and through the holes in the platform.

2. The combination of claim 1 wherein the support includes means for holding the substrate in a fixed position, the holding means comprising holes in the support connected to the vacuum device, for applying a vacuum to the substrate.

3. The combination of claim 1 further comprising a multiple of locators disposed about the perimeter of the substrate when it is supported by the support, including a locator being fixed, and a locator in opposed position to the fixed locator, being movable in the plane of the substrate between a loading position and a locating position, the movable locator when moved to their locating position moving the substrate against the fixed locator.

4. The combination of claim 3 wherein the movable locator moves from the loading position to the locating position prior to the holding means holding the substrate in a fixed position and return to the loading position after the holding means holds the substrate in a fixed position.

5. An apparatus and conductive ink printer combination comprising;
    the conductive ink printer for printing conductive ink material on the top surface of the substrate;
    and the apparatus comprising at least two substantially flat shoulders for supporting a substrate in a particular position with the bottom surface of the substrate in a particular plane;
    a substantially flat plate for interacting with an interior portion of the substrate, the plate having holes corresponding to and aligned with the holes in the substrate when the substrate is in the particular position;
    an actuator for moving the plate in a generally perpendicular direction from a first position wherein the top surface of the substantially flat plate is in the same plane as the plane of the flat shoulders, to a second position wherein the flat plate is positioned so that the plane of the substrate top surface is spaced apart from the plane that the flat shoulders is in; and
    a vacuum device communicating with the holes in the plate for drawing the ink through the through holes in the substrate and the holes in the plate;
    wherein said shoulders and said plate in said first position provide a substantially continuous flat surface for supporting the substrate.

* * * * *